United States Patent

Wang

[15] 3,684,970

[45] Aug. 15, 1972

[54] SONIC WAVE COUPLER AND AMPLIFIER WITH DETERMINABLE DELAY CHARACTERISTICS

[72] Inventor: Wen-Chung Wang, 25 Trescott Path, Northport, N.Y. 11768

[22] Filed: Dec. 29, 1970

[21] Appl. No.: 102,456

[52] U.S. Cl. ......................330/5.5, 330/12, 333/30 R

[51] Int. Cl. ..................................................H03f 3/04

[58] Field of Search ..........................................330/5.5

[56] References Cited

UNITED STATES PATENTS

| | | | |
|---|---|---|---|
| 3,582,540 | 6/1971 | Adler et al. | 330/5.5 |
| 3,388,334 | 6/1968 | Adler | 330/5.5 |

OTHER PUBLICATIONS

White, " Proc. IEEE," Aug. 1970, pp. 1238- 1276 (p. 1258 particularly).

*Primary Examiner*—Roy Lake
*Assistant Examiner*—Darwin R. Hostetter
*Attorney*—Darby & Darby

[57] ABSTRACT

A sonic wave coupler and amplifier formed by a preferably anisotropic substrate having a plane surface with an electrically biased piezoelectric semiconductor solid juxtaposed thereto and preferably a thin fluid couplant layer between said substrate and semiconductor solid. A generator coupled to said substrate launches sonic waves in a direction parallel to the interface between the substrate and the semiconductor solid and the velocities in the media are such that the wave penetrates (deeply penetrates in the preferred embodiments) the semiconductor solid and is amplified by an electric field component parallel to the wave propagation direction. By a reciprocal process the sonic waves reenter the substrate and are received by a receiver. Time delay characteristics may be obtained by multiple reflections of elastic energy waves within the semiconductor.

13 Claims, 6 Drawing Figures

INVENTOR.
WEN-CHUNG WANG

BY
Darby & Darby

ATTORNEYS

SONIC WAVE COUPLER AND AMPLIFIER WITH DETERMINABLE DELAY CHARACTERISTICS

BACKGROUND OF THE INVENTION

The present invention relates to sonic wave couplers and amplifiers, and more particularly to devices for obtaining amplification of acoustic surface waves coupled from one substrate to an adjacent substrate by means of a fluid couplant.

Heretofore, amplification of acoustic waves propagating in a solid has been achieved by devices consisting essentially of two components, an anisotropic substrate and a proximal semiconductive medium. The substrate is usually a member of "X-cut" or "Y-cut" piezoelectric material so that an acoustic wave propagating therein will have large components in a preferred direction, normally coinciding with the longitudinal axis of the substrate. The semiconductive medium is electrically biased so that current carriers drift parallel to the preferred propagating direction of acoustic waves traveling in the substrate. This semiconductive medium has taken at least two forms, one being a thin semiconductive film contiguous with and extending along one side of the substrate, such as that disclosed by Tien in U.S. Pat. No. 3,158,819, and the other a semiconductive crystal adjacent the substrate but separated therefrom by an air gap normally equal in thickness to a small fraction of the wavelength of acoustic waves launched in the substrate. This latter type has been disclosed by J.H. Collins, K.M. Lakin, C.F. Quate, and H.F. Shaw, in their article entitled "Amplification of Surface Waves with Adjacent Semiconductor and Piezoelectric Semiconductor," appearing in Applied Physics Letters, Volume 13, pages 314–316, November, 1968.

In each of the prior art forms of acoustic wave amplifiers, conventional input and output transducers are disposed at either end of the elastic substrate, for the purpose of exciting and detecting, respectively, an elastic wave propagating along the preferred longitudinal axis of the substrate. Amplification is achieved by a coupling between an electric field generated by the traveling acoustic wave, which field permeates the proximal semiconductor, and the electric space charges produced within the semiconductor by such permeation. These prior amplifiers do not provide for a transfer of elastic energy from the substrate to the semiconductor, and therefore must depend upon a strong electric field being generated by propagation of the acoustic wave in the substrate. Under such circumstances, the gain to be achieved by these devices will normally be dependent upon the use of a highly expensive substrate, such as lithium niobate.

It has also been found that these prior devices, especially the Collins, Lakin, Quate, and Shaw devices, with respect to which the width of the narrow air gap is critical, are extremely difficult to fabricate. In addition, the delay-line characteristics and utility of these prior devices are minimal, and depend entirely upon the length of the substrate medium. Such devices may not effectively be employed in situations offering minimal space and requiring maximum delay-line characteristics.

Accordingly, the preferred form of the present invention provides a layered structure consisting of three elastic mediums which allow for coupling of elastic waves from one substrate to an adjacent substrate by means of a fluid intermediary. Such an arrangement provides for high-gain amplification in accordance with known physical principles, and for increased time delay characteristics owing to the transfer of elastic energy back and forth between the adjacent solids.

It is one object of the present invention to provide a sonic wave coupler and amplifier of elastic waves propagating in a solid.

Another object of the present invention is to provide an inexpensive and easily fabricated sonic wave coupler and amplifier.

Still another object of the present invention is to provide a sonic wave delay line and amplifiers having determinable long time-delay characteristics.

BRIEF DESCRIPTION OF THE DRAWINGS

For a further understanding of the present invention, reference may be had to the accompanying drawings in which.

BRIEF DESCRIPTION OF THE PREFERRED EMBODIMENTS

Figure 1:
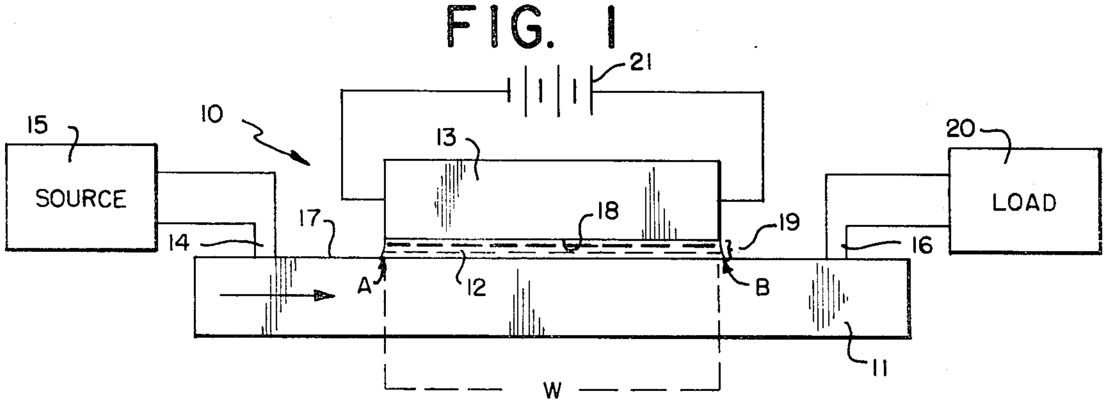
FIG. 1 is a side-elevational view of the sonic wave coupler and amplifier of the present invention.
Figure 2:
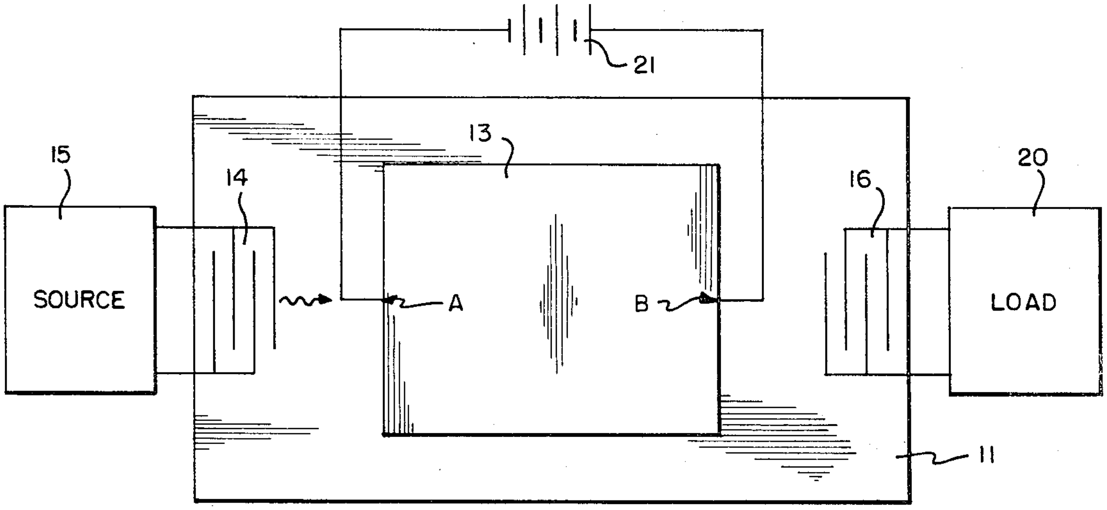
FIG. 2 is a plan view of the apparatus of FIG. 1.

Referring now to the drawings, and in particular to FIG. 1 and FIG. 2, in which there is illustrated a preferred sonic wave coupler and amplifier, generally indicated by reference numeral 10, and consisting of an acoustically continuous composite layered structure which includes a first solid layer 11, an intermediate fluid layer 12, and a second solid layer 13.

The first solid layer, or substrate, 11, is preferably a piezoelectric crystal such as alpha-quartz ($SiO_2$), which may be either X-cut or Y-cut so that elastic waves propagating therein will have major components in a preferred direction. In the present embodiment, this preferred direction may be arbitrarily defined as the longitudinal axis of the substrate, and is indicated by the arrow in FIGS. 1 and 2. Other piezoelectric materials such as lithium niobate are also acceptable for the substrate 11. It should be noted, however, that the invention is not to be limited by the choice of a piezoelectric material for substrate 11, and that either anisotropic or isotropic solids may be employed without departing from the scope of the invention. Piezoelectric material is preferred merely because elastic surface waves may be easily generated therein, and such waves have been found to yield the best results.

A pair of (illustratively, 30 megacycle) interdigital surface wave transducers, 14 an 16, may be depositied on an optically polished planar surface 17 of the substrate 11. These two transducers may be positioned respectively at opposite ends of the surface 17, to provide means for exciting and detecting an elastic surface wave, or Rayleigh wave. It is important to note that the particular kind of transducer 14 and 16 may be varied, as desired, without departing from the scope of the invention. Interdigital surface transducers are preferred because they are efficient; however, wedge-type transducers (not shown) may also be used to generate surface waves in the substrate. Suitable amplification has also been observed where bulk waves have been launched in the substrate, and known types of transducers disposed at either end of the substrate may be utilized for this purpose, as desired, without departing from the scope of the invention.

The transducer 14 may be connected to a source 15 of electrical pulse energy. When an electric signal is placed across adjacent digits of an interdigital transducer, mounted on the surface of a piezoelectric material such as substrate 11, the difference in potential induces physical stresses and strains on such surface which effect propagation of a Rayleigh wave in the direction indicated by the arrow shown in FIG. 1. The velocity with which such surface wave travels normally depends upon the elastic constants of the material, and for alpha-quartz, this velocity has been found to be approximately $3.15 \times 10^5$cm/second. The transducer 16 may be connected to an appropriate load 20, and converts a traveling Rayleigh wave to an electrical pulse by the reverse of the process which occurred in the transducer 14.

The adjacent solid medium 13 is preferably a piezoelectric semiconductor such as cadmium sulfide; however, it has been found that other types of piezoelectric material such as indium antimonate may also be used to achieve suitable amplification, in the manner to be described below.

The semiconductor 13 may be provided with an optically polished planar surface 18. This surface 18 is disposed adjacent the surface 17 of the substrate 11, and substantially parallel thereto. In the preferred embodiment of the invention, the parallel surfaces 17 and 18 are separated a narrow predetermined distance by a couplant space indicated by reference numeral 19, and which will be explained more fully below. It should be noted, however, that acceptable results conceptually are possible when the surfaces are optically bonded so as to form an elastic wave-conducting interface between the substrate 11 and the semiconductor 13, and this variation omitting element 19 is within the scope of the invention. A DC voltage source 21 may be applied across the semiconductor 13 in such a way that the net electron flow in the semiconductor will be in the same direction as the Rayleigh wave launched in the substrate 11. When the present device is intended to operate as an amplifier of acoustic waves, it has been found that the optical axis of the semiconductor 13 should preferably be oriented substantially perpendicular to the surface 17 of the substrate 11.

In the preferred form of the invention, the intermediate fluid film 12 is disposed within the space 19 to form an interface with each of the planar surfaces 17 and 18, respectively. The layer 12 is positioned along the surface 17 in the path to be followed by a propagating Rayleigh wave.

To achieve the preferred parallelism between the surfaces 17 and 18, a vertical micrometer lead screw (not shown) may be used to allow vertical positioning of the semiconductor 13. Since, as will be explained below, it is preferable that the separation 19 be as small as possible, the fluid layer is held in position between the adjacent solids by capillary action.

This fluid layer is preferably silicone fluid; however, it has been found that nearly any fluid medium such as water, grease, etc., is suitable for present purposes. Of course, for long term use, relatively non-volatile liquids are preferable. The velocity of elastic waves propagating therein depends upon the frequency of the elastic wave, the thickness of the layer medium and the elastic properties of the fluid itself.

Where it is desired to have the present composite structure function as an acoustic wave coupler, it is preferable that the fluid medium be thin enough that an elastic wave propagating therein will travel at a velocity which is equal to or less than the velocity of a traveling Rayleigh wave will be converted at the point A in FIG. 1, to a layer wave traveling in the fluid 12. Where the velocity of the layer wave propagating in the fluid layer 12 is less than the velocity with which elastic waves propagate through the semiconductive medium 13, this sonic wave will be bounded to and guided by the fluid layer 12. This phenomenon has been described by W.C. Wang et al. in Volume 16, No. 8 Applied Physics Letters, p. 291, April 15, 1970. Such a bounded wave will reconvert to a Rayleigh wave at the point B and be detected at transducer 16.

If amplification of the bounded longitudinal acoustic wave is to take place, it is essential that the velocity of Rayleigh waves propagating in the substrate 11 be greater than the velocity with which elastic energy propagates in the medium 13. Under such circumstances there is a significant penetration of elastic energy into the medium 13, but relatively slight penetration of energy into the substrate 11. In accordance with known principles similar to those underlying the operation of the conventional traveling wave tube microwave amplifier, the bounded wave may be amplified as a result of interaction between the electric field in the semiconductor 13 and an electric field established by and accompanying the elastic energy penetrating the piezoelectric medium 13.

In accordance with a preferred embodiment in which cadmium sulfide is used for the semiconductive medium 13, the transverse wave velocity of the medium is approximately $1.75 \times 10^5$ cm/second. When the layer wave velocity in this embodiment is greater than the transverse wave velocity, the propagating layer wave will direct ("leak") energy into the cadmium sulfide crystal 13 as it travels from point A. Such energy takes the form of a propagating transverse wave and it is excited within the cadmium sulfide crystal at a point preferably near the point A, provided that the layer velocity is sufficiently greater than the transverse velocity. The direction of propagation of the transverse wave, with respect to the normal to the surface of the substrate 11 is defined by the angle $\theta = \sin^{-1} V_t/V_L$, where $V_t$ is the transverse wave velocity and $V_L$ is the layer wave velocity. Empirical data suggests that this newly excited bulk wave propagates through the cadmium sulfide medium toward the upper surface thereof from which it is reflected toward the point B of FIG. 1. At point B, it reconverts to a surface wave in the substrate 11 and is detected by the output transducer 16.

Amplification is achieved, as in the bounded wave embodiment, by interaction between the electric field established by the DC voltage source 21 and that generated by the traveling bulk wave in the piezoelectric medium 13. In each case, the carrier drift velocity established by DC source 21 should be slightly greater than the elastic wave velocity (for cadmium sulfide 2 KV per centimeter). It may also be desirable to subject the electrically biased piezoelectric medium to a magnetic field which will force the current carrier to move through this medium by following a helical drift pattern. Some improvement in amplification is to be expected under such circumstances.

It is important to note that the preferred arrangement has been observed to initiate an additional time delay of approximately 2 microseconds beyond the delay which may be achieved as a result merely of the delay line substrate 11.

Figure 6:
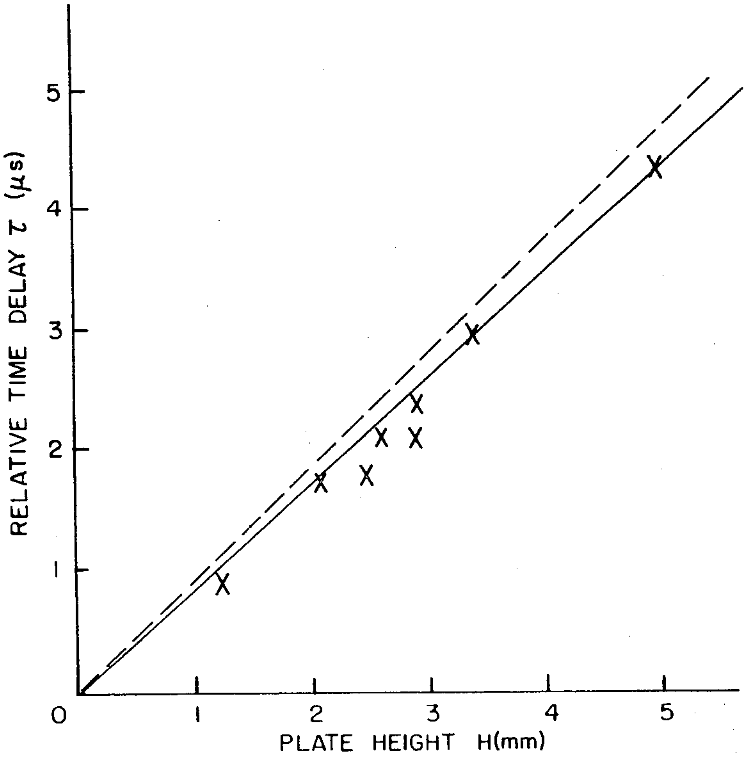
FIG. 6 is a graph of empirical and theoretical time delay data plotted against the height of a semiconductive medium.

FIG. 6 is a graph comparing theoretical and empirical data showing the relationship between relative time delay and the height of the cadmium sulfide crystal 13. The experimental data, represented by the "X" marks, were derived under the condition, to be more fully described below, that the longitudinal dimension of the cadmium sulfide crystal was such that no multiple reflection of the transverse bulk wave would take place within the crystal. This data is observed to correlate well with theoretical data computed upon the assumption that the layer velocity is $2.8 \times 10^5$ cm/second (solid line) and that layer velocity and surface velocity both equal $3.15 \times 10^5$ cm/second (dotted line). It will be observed that under such circumstances additional time delays of up to 5 microseconds may occur.

Further time delay may be achieved by reducing the longitudinal dimension of the crystal 13. For example, if this dimension (represented by the distance between the points A and B of FIG. 1) is 0.3 cm, a time delay of approximately 4 microseconds beyond that defined by normal delay-line characteristics of the substrate 11, can be achieved. Since, for a given ratio of transverse velocity to layer velocity, elastic energy leaking into the semiconductor medium 13 will propagate at a constant angle $\theta$, the additional time delay observed with decreasing longitudinal length of the medium 13 is explained by multiple reflections of the transverse wave within the medium.

Figure 3:
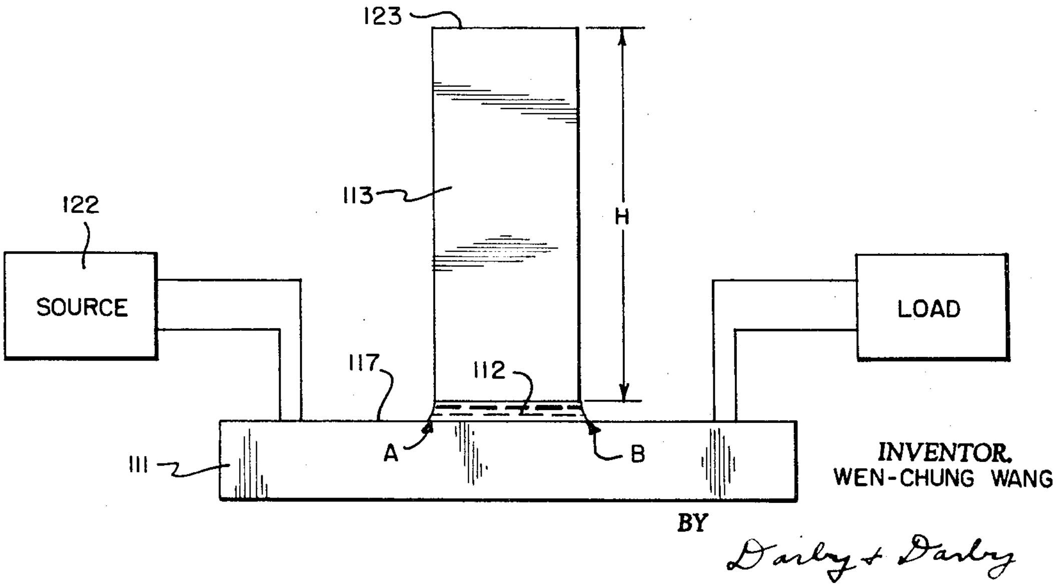
FIG. 3 illustrates an alternate arrangement of the components of a sonic wave coupler which provides a relatively long time delay.

FIG. 3 depicts an alternate form of the invention which may be used to achieve extremely long time delays by initiating multiple reflections within the semiconductive medium 113. For example, if the height (H) of medium 113 is 0.5 cm, and the distance between point A and B is also 0.5 cm, where 0.5 cm is less than the theoretical "skip" distance ($2H\tan\theta$) of a transverse wave propagating within the medium 113 toward the upper surface 123 at the angle $\theta$, additional pulse delays of more than 40 microseconds have been observed.

It is important to note that if the structure of FIG. 3 is to be used as an acoustic wave amplifier, then the optical axis of the piezoelectric medium 113 must be perpendicular to the surface 117 of the substrate 111. In addition, some DC voltage source (not shown) must be applied across the medium, as described above. For delay-line use however, and at relatively high frequencies generated by electrical pulse source 122, the losses are minimal and amplification may not always be necessary or desirable.

Figure 4:
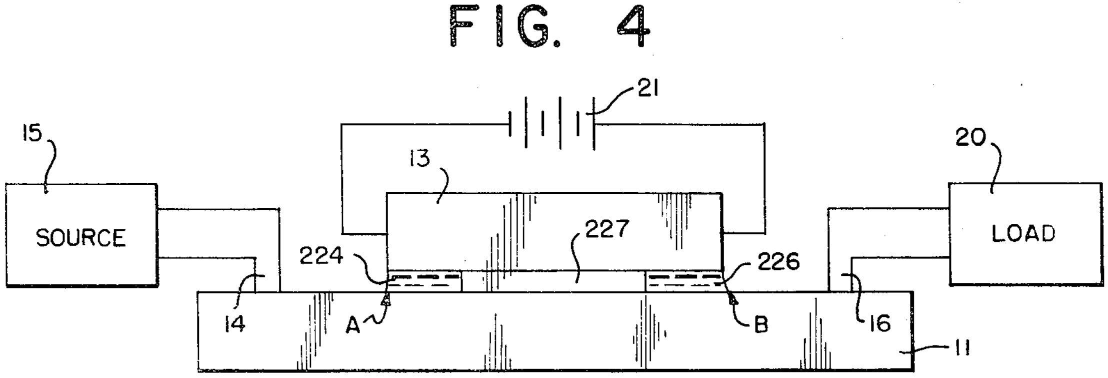
FIG. 4 is a side-elevational view of an alternate embodiment of the present invention.

As has been mentioned above, for extremely thin intermediate fluid layers 12 (FIG. 1), the layer wave velocity is relatively high and elastic energy leaks from fluid layer 12 into the piezoelectric medium 13 very near to the point A, and is reconverted to surface energy near to the point B. Accordingly, it may not always be necessary for separation 19 to be completely filled by a fluid layer. FIG. 4 illustrates an alternate embodiment of the present invention, wherein the intermediate fluid layer is divided into two separate layers 224 and 226. Any solid material 227 may conveniently be disposed between the fluid layers.

Figure 5:
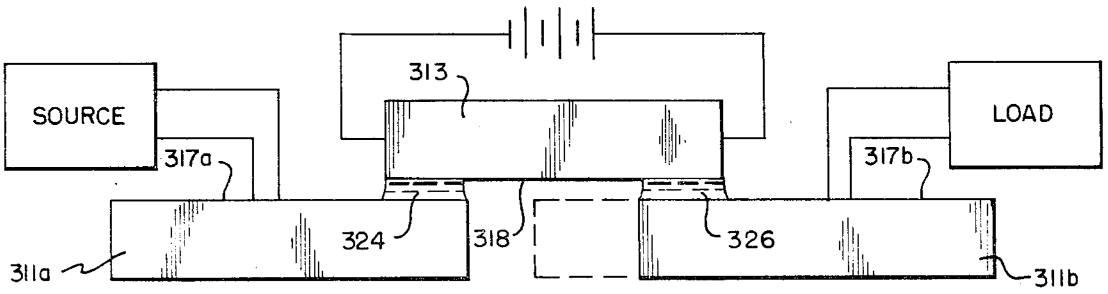
FIG. 5 is a side-elevational view of still another embodiment of the present invention.

In FIG. 5, another embodiment of the invention is shown, wherein substrate 11 is divided into two portions 311*a* and 311*b*, either or both of which may be movable relative to the other. Each portion is provided with an optically polished planar surface 317*a* and 317*b*. The polished planar surface 318 of the semiconductive medium 313 is disposed adjacent and substantially parallel to each of the surfaces 317*a* and 317*b*. A pair of fluid layers 324 and 326 is arranged between adjacent planar surfaces to facilitate the transfer of elastic energy between the constituent solids. Under the condition specified above, a continuous variable delay may be achieved by moving one of the substrate portions 311*b*, as indicated by the dotted lines in FIG. 5.

It should be noted that the preferred form of the present amplifier has been operated successfully at relatively high frequency (100 MhZ) pulsed input signals. Where the substrate is composed of the relatively expensive lithium niobate, and the fluid layer couplant is grease, a terminal (net) gain of 20db and electronic gain of more than 60db has been realized.

In addition to the variations and modifications of the invention shown or suggested, combinations of such variations and other modifications will be apparent to those skilled in the art and the invention should not be deemed to be limited to the specific embodiments shown or suggested.

What is claimed is:

1. An amplifier comprising:

a substrate element;

means for generating elastic energy in said substrate, said energy to propagate at a first predetermined velocity and a predetermined direction;

a piezoelectric semiconductive element adjacent said substrate and interfaced therewith, the interface being substantially parallel to said predetermined direction, said piezoelectric element having a second predetermined velocity of propagation for elastic energy less than said first velocity, whereby elastic energy propagating through said substrate in said predetermined direction induces propagation of elastic energy in said piezoelectric element in a direction generally parallel to said interface, said induced elastic energy to generate a travelling electric field within said piezoelectric element;

means for applying a fixed electric field across a portion of said piezoelectric element to act in a direction generally parallel to said interface thereby to augment the effects of said travelling electric field to amplify said induced elastic energy; and means for extracting energy from one of said elements.

2. The amplifier as recited in claim 1, wherein said interface comprises an optically efficient interface formed between said substrate and said piezoelectric element.

3. The amplifier as recited in claim 1, wherein each of said elements comprises an optically polished planar surface, said surfaces being juxtaposed substantially parallel to each other across a separation of predetermined width between said elements.

4. The amplifier as recited in claim 3, wherein said interface comprises at least a first fluid layer disposed within said separation to form an interface with each of said planar surfaces, respectively, and having a third velocity of propagation for elastic energy, said third velocity having a value falling within a permissible range of which said first velocity is a maximum.

5. The amplifier as recited in claim 4, wherein said substrate comprises a member of piezoelectric material, and said means for generating elastic energy in said substrate comprises a first interdigital transducer connected at one end of the planar surface of said substrate, said transducer being connected to a source of electrical pulses for exciting elastic surface waves in said substrate.

6. The amplifier as recited in claim 5, wherein said substrate comprises a member of X-cut piezoelectric material whereby surface waves excited in said substrate propagate in said predetermined direction.

7. The amplifier as recited in claim 6, wherein the ratio of said third velocity to said second velocity is such that energy transferring between said elements has major component vectors oriented substantially in said predetermined direction.

8. The amplifier as recited in claim 7, wherein said piezoelectric element has an optical axis substantially perpen-dicular to the planar surface of said substrate.

9. The amplifier as recited in claim 8, wherein said means for applying an electric field across said piezoelectric element comprises means for causing current carriers in said piezoelectric element to flow substantially in said predetermined direction.

10. The amplifier as recited in claim 9, wherein said current carriers flow at a velocity slightly greater than said second velocity.

11. The amplifier as recited in claim 10, wherein said means for applying an electric field across said piezoelectric element comprises a DC voltage source.

12. The amplifier as recited in claim 11, wherein said transferring means comprises, in addition, a second fluid layer disposed within said separation, and laterally displaced from said first fluid layer, to form an interface with each of said planar surfaces, respectively.

13. An acoustic delay-line amplifier comprising:

an X-cut piezoelectric substrate having an optically polished planar surface;

means for generating Rayleigh waves in said surface, said waves to propagate at a predetermined velocity;

a piezoelectric semiconductive element adjacent said substrate and comprising, an optical axis substantially perpendicular to the planar surface of said substrate, an optically polished planar surface spaced from the planar surface of said substrate by a predetermined distance and disposed substantially parallel thereto, said element having a predetermined velocity of propagation for transverse acoustic waves, which velocity is less than said Rayleigh wave velocity;

at least a first substantially non-volatile fluid layer disposed within said separation to form an interface with each of said planar surfaces respectively, said layer having a predetermined velocity of propagation for longitudinal acoustic waves which is greater than said transverse wave velocity and has a maximum value substantially equal to said Rayleigh wave velocity, whereby Rayleigh waves propagating along the planar surface of said substrate excite propagation of transverse waves in said element in a direction generally parallel to said separation, said transverse waves to generate a travelling electric field within said element;

means for applying a fixed electric field across a portion of said element to act in a direction generally parallel to the direction of propagation of said transverse waves, thereby to augment the effects of said travelling electric field to amplify said transverse waves; and means for extracting Rayleigh waves from said substrate.

* * * * *